United States Patent
Schenker et al.

(10) Patent No.: US 10,553,532 B2
(45) Date of Patent: Feb. 4, 2020

(54) STRUCTURE AND METHOD TO SELF ALIGN VIA TO TOP AND BOTTOM OF TIGHT PITCH METAL INTERCONNECT LAYERS

(71) Applicant: INTEL CORPORATION, Santa Clara, CA (US)

(72) Inventors: Richard E. Schenker, Portland, OR (US); Manish Chandhok, Beaverton, OR (US); Robert L. Bristol, Portland, OR (US); Mauro J. Kobrinsky, Portland, OR (US); Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/529,484

(22) PCT Filed: Dec. 24, 2014

(86) PCT No.: PCT/US2014/072392
§ 371 (c)(1),
(2) Date: May 24, 2017

(87) PCT Pub. No.: WO2016/105422
PCT Pub. Date: Jun. 30, 2016

(65) Prior Publication Data
US 2017/0263553 A1  Sep. 14, 2017

(51) Int. Cl.
*H01L 23/522* (2006.01)
*H01L 23/528* (2006.01)
(Continued)

(52) U.S. Cl.
CPC ...... *H01L 23/5226* (2013.01); *H01L 21/0337* (2013.01); *H01L 21/31144* (2013.01);
(Continued)

(58) Field of Classification Search
CPC . H01L 21/768; H01L 21/308; H01L 21/4763; H01L 23/48; H01L 21/02;
(Continued)

(56) References Cited

U.S. PATENT DOCUMENTS

| | | |
|---|---|---|
| 4,151,421 A | 4/1979 | Sumi |
| 5,294,800 A | 3/1994 | Chung et al. |

(Continued)

FOREIGN PATENT DOCUMENTS

| | | |
|---|---|---|
| JP | 2008-235704 | 10/2008 |
| JP | 2013-93567 A | 5/2013 |
| WO | 2008-149808 | 12/2008 |

OTHER PUBLICATIONS

Office Action and Search Report—Taiwanese Patent Application No. 104114141; dated Jul. 1, 2016; 4 pages.

(Continued)

*Primary Examiner* — Alexander O Williams
(74) *Attorney, Agent, or Firm* — Schwabe, Williamson & Wyatt, P.C.

(57) ABSTRACT

Embodiments of the invention include interconnect structures with overhead vias and through vias that are self-aligned with interconnect lines and methods of forming such structures. In an embodiment, an interconnect structure is formed in an interlayer dielectric (ILD). One or more first interconnect lines may be formed in the ILD. The interconnect structure may also include one or more second interconnect lines in the ILD that arranged in an alternating pattern with the first interconnect lines. Top surfaces of each of the first and second interconnect lines may be recessed below a top surface of the ILD. The interconnect structure may include a self-aligned overhead via formed over one or more of the first interconnect lines or over one or more of the second interconnect lines. In an embodiment, a top surface (Continued)

of the self-aligned overhead via is substantially coplanar with a top surface of the ILD.

25 Claims, 11 Drawing Sheets

(51) Int. Cl.
    *H01L 21/768*     (2006.01)
    *H01L 21/033*     (2006.01)
    *H01L 21/311*     (2006.01)
    *H01L 23/532*     (2006.01)

(52) U.S. Cl.
    CPC .... *H01L 21/7682* (2013.01); *H01L 21/76808* (2013.01); *H01L 21/76816* (2013.01); *H01L 21/76834* (2013.01); *H01L 21/76883* (2013.01); *H01L 21/76897* (2013.01); *H01L 23/5283* (2013.01); *H01L 23/53295* (2013.01)

(58) Field of Classification Search
    CPC ..... H01L 27/08; H01L 21/60; H01L 23/5226; H01L 21/76834; H01L 21/76808; H01L 21/816; H01L 21/7682; H01L 21/76883; H01L 21/76897; H01L 23/5283; H01L 23/53295; H01L 21/31144; H01L 21/0337; H01L 23/522; H01L 23/528; H01L 21/033; H01L 21/311
    USPC .................................................. 257/774, 773
    See application file for complete search history.

(56) References Cited

U.S. PATENT DOCUMENTS

| | | | |
|---|---|---|---|
| 5,929,454 | A | 7/1999 | Muraki et al. |
| 6,051,882 | A | 4/2000 | Avanzino |
| 6,352,916 | B1* | 3/2002 | Tang ................. H01L 21/76801 257/E21.576 |
| 6,352,917 | B1 | 3/2002 | Gupta et al. |
| 6,426,558 | B1 | 7/2002 | Chapple-Sokol |
| 7,704,653 | B2 | 4/2010 | Lordi et al. |
| 7,939,445 | B1* | 5/2011 | Sutardja ............ H01L 21/76838 257/E21.575 |
| 9,502,288 | B2* | 11/2016 | Nguyen ............ H01L 21/76846 |
| 2004/0119134 | A1 | 6/2004 | Goldberg et al. |
| 2009/0001348 | A1 | 1/2009 | Kaeriyama et al. |
| 2009/0200668 | A1* | 8/2009 | Yang ................. H01L 21/76834 257/751 |
| 2010/0246240 | A1 | 9/2010 | Nakaya |
| 2011/0021036 | A1* | 1/2011 | Braecklmann ...... H01L 21/7682 438/763 |
| 2012/0175733 | A1* | 7/2012 | Kastenmeier ..... H01L 21/76802 257/532 |
| 2012/0280224 | A1 | 11/2012 | Doolittle et al. |
| 2013/0302989 | A1 | 11/2013 | Kenny et al. |
| 2013/0323930 | A1* | 12/2013 | Chattopadhyay ........................... H01L 21/02107 438/703 |
| 2013/0328208 | A1 | 12/2013 | Holmes et al. |
| 2014/0038412 | A1* | 2/2014 | Hu .................... H01L 21/76811 438/689 |
| 2015/0093702 | A1* | 4/2015 | Nyhus .................. G03F 7/0392 430/270.1 |
| 2015/0170961 | A1* | 6/2015 | Romero ............ H01L 21/76838 438/641 |
| 2017/0207116 | A1* | 7/2017 | Nyhus ............... H01L 21/76816 |
| 2017/0221810 | A1* | 8/2017 | Wallace ............ H01L 21/76897 |

OTHER PUBLICATIONS

International Preliminary Report on Patentability—PCT Application No. PCT/US2014/071650; dated Dec. 22, 2016; 7 pages.
International Search Report and Written Opinion—PCT Patent Application No. PCT/US2014/044439; dated Mar. 24, 2015; 12 pages.
Borodvsky, Yan; "Complementary Lithography at Insertion and Beyond" Semicon West 2012, Jun. 11, 2012; San Francisco, CA; 30 pages.
International Search Report and Written Opinion for PCT/US20141072392, dated Sep. 24, 2015, 11 pages.
International Preliminary Report on Patentability for PCT/US2014/072392, dated Jul. 6, 2017, 8 pages.
Search Report for European Patent Application No. 14909262.9, dated Jul. 19, 2018, 9 pages.
Office Action and Search Report for Taiwan Patent Application No. 104138812, dated Apr. 15, 2019, 13 pages with English translation.
Office Action and Search Report for Taiwan Patent Application No. 104138812, dated Aug. 7, 2019, 11 pages.

\* cited by examiner

US 10,553,532 B2

STRUCTURE AND METHOD TO SELF ALIGN VIA TO TOP AND BOTTOM OF TIGHT PITCH METAL INTERCONNECT LAYERS

CROSS-REFERENCE TO RELATED APPLICATION

This patent application is a U.S. National Phase Application under 35 U.S.C. § 371 of International Application No. PCT/US2014/072392, filed Dec. 24, 2014, entitled STRUCTURE AND METHOD TO SELF ALIGN VIA TO TOP AND BOTTOM OF TIGHT PITCH METAL INTERCONNECT LAYERS.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

Modern integrated circuits use conductive interconnect layers to connect individual devices on a chip and/or to send and/or receive signals external to the device. Common types of interconnect layers include copper and copper alloy interconnect lines coupled to individual devices, including other interconnect lines by interconnect through vias. It is not uncommon for an integrated circuit to have multiple levels of interconnections. For example, two or more interconnect layers may be separated from each other by dielectric materials. The dielectric layers separating interconnect levels are commonly referred to as an interlayer dielectric (ILD).

As these interconnect layers are manufactured with interconnect lines having smaller pitches in order to accommodate the need for smaller chips, it becomes increasingly difficult to properly align the vias with the desired interconnect layer. In particular, during manufacturing, the location of the via edges with respect to the interconnect layer or line it is to contact may be misaligned due to natural manufacturing variation. A via however, must allow for connection of one interconnect line of one interconnect layer to the desired underlying layer or line without erroneously connecting to a different interconnect layer or line. If the via is misaligned and contacts the wrong metal feature, the chip may short circuit resulting in degraded electrical performance. One solution to address this issue is to reduce the via size, for example, by making the via narrower. However, reducing the via size results in an increase in resistance and reduces the yield during manufacturing.

DETAILED DESCRIPTION OF THE INVENTION

Described herein are systems that include an interconnect structure that allows for contact formation to tightly pitched interconnect lines that include self-aligned overhead vias and self-aligned through vias and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

Figure 1:
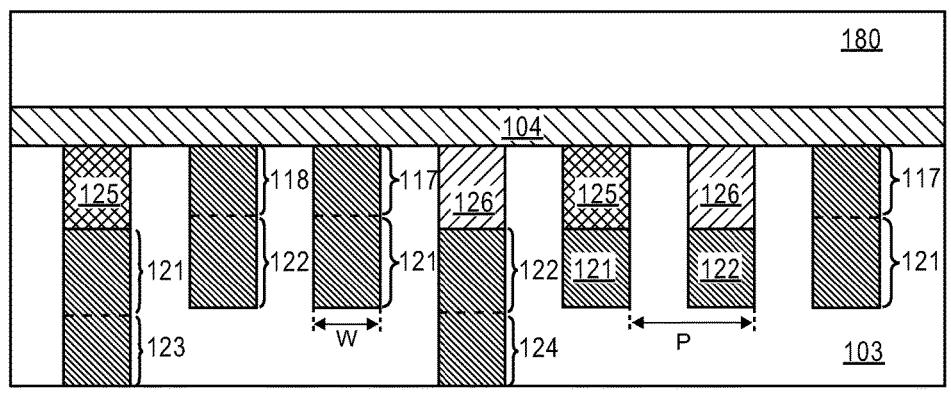
FIG. 1 is a cross-sectional illustration of an interconnect structure that includes self-aligned overhead vias and self-aligned through vias, according to an embodiment.

FIG. 1 is a cross-sectional illustration of an interconnect structure 100 according to an embodiment of the invention. The interconnect structure 100 may be used in conjunction with any semiconductor device that utilizes one or more interconnect layers, such as an IC circuit or the like. Interconnect structure 100 is formed in an interlayer dielectric (ILD) 103. Embodiments of the invention utilize low-k dielectric materials that are typically known in the art for use as ILDs such as, silicon dioxide. According to embodiments of the invention, low-k dielectric materials suitable for formation of the ILD 103 may also include, but are not limited to, materials such as carbon doped silicon dioxide, porous silicon dioxide, or silicon nitrides. Additional embodiments of the invention may include an ILD 103 formed from dielectric materials with k-values less than 5. Embodiments may also include an ILD with a k-value less than 2. According to embodiments of the invention, ILD 103 may be less than 100 nm thick. According to additional embodiments, the ILD 103 may be less than 40 nm thick. An additional embodiment of the invention may further include an ILD 103 with a thickness between 40 nm and 80 nm. Additional embodiments include an ILD 103 that is approximately 60 nm thick.

In an embodiment, an etchstop layer 104 is formed over the top surface of the ILD 103. By way of example, the etchstop layer 104 may be a dielectric material, such as a nitride or an oxide. According to an embodiment, the etchstop layer 104 is resistant to an etching process that may be used to etch through a second interconnect layer 180, such as an additional ILD layer used for forming interconnects, that may be formed above the etchstop layer 104. Embodiments of the invention include an etchstop layer that is between 3 nm and 10 nm thick.

According to an embodiment, interconnect structure 100 includes first and second interconnect lines 121, 122 formed into the ILD 103 in an alternating pattern, as shown in FIG. 1. The first and second interconnect lines 121, 122 are formed with conductive materials. By way of example, and not by way of limitation, the conductive materials used to form the interconnect lines may include, Cu, Co, W, NiSi, TiN, Mo, Ni, Ru, Au, Ag, or Pt. In an embodiment, the same conductive material is used to form the first and second interconnect lines 121, 122. According to an alternative embodiment, the first and second interconnect lines 121, 122 are formed with different conductive materials.

The interconnect lines 121, 122 are spaced apart from each other by a pitch P. Embodiments of the invention include high density interconnect lines with a pitch P less than 60 nm. Further embodiments of the invention include a pitch P that is less than 30 nm. Embodiments of the invention include interconnect line widths W less than 30 nm. Additional embodiments of the invention include interconnect line widths W less than 15 nm.

In an embodiment, the first and second interconnect lines 121, 122 are recessed such that a top surface of the ILD 103 is formed above the top surface of the interconnect lines 121, 122. Recessing the interconnect lines 121, 122 provides space in the ILD 103 for forming dielectric caps 125, 126 or an overhead via 117, 118 above each of the interconnect lines 121, 122, according to an embodiment of the invention. According to an embodiment, the first and second overhead vias 117, 118 are formed within the same trench as the first and second interconnect lines 121, 122, respectively, and are therefore referred to herein as being "self-aligned" with the interconnect lines 121, 122. Due to the self-alignment, the alignment between the interconnect lines and the overhead vias is substantially error free.

Figure 4A:
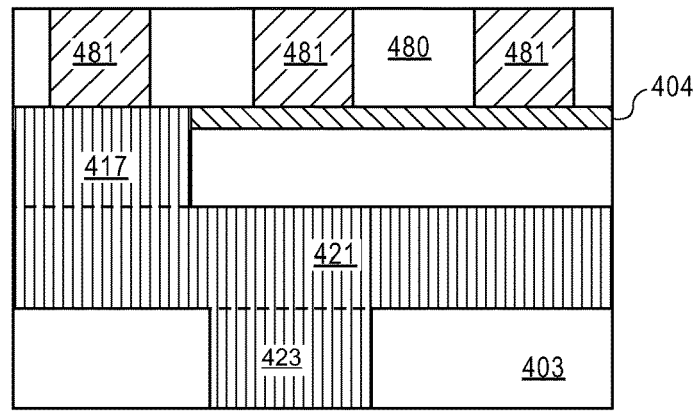
FIGS. 4A-4C are cross-sectional illustrations that illustrate a method of improving a shorting margin between an overhead via and a neighboring contact, according to an embodiment.

A dashed line is illustrated between the first overhead via 117 and the first interconnect line 121 and between the second overhead via 118 and the second interconnect line 122 to more clearly indicate where the interconnect lines end and the through vias begin. However, it is to be appreciated that the two features may be formed with the same material, and there may be no discernable junction between them when viewed in the cross-sectional view illustrated in FIG. 1. Referring briefly to FIG. 4A, a cross-sectional view that is orthogonal to the view of FIG. 1 is provided in order to more clearly illustrate the difference between the interconnect lines and the overhead vias. As illustrated in FIG. 4A, a first interconnect line 421 in has a length that is greater than the length of a first overhead via 417. The remainder of FIG. 4A will be discussed in greater detail below.

As illustrated in FIG. 1, first dielectric caps 125 may be formed above the first interconnect lines 121. In an embodiment, top surfaces of the first dielectric caps 125 may be substantially coplanar with a top surface of the ILD layer 103. Embodiments of the invention further include second dielectric caps 126 that are formed above the second interconnect lines 122. In an embodiment, top surfaces of the second dielectric cap 126 may be substantially coplanar with a top surface of the ILD layer 103.

Embodiments of the invention include first and second dielectric caps 125, 126 made from dielectric materials such as $SiO_xC_yN_z$, non-conductive metal oxides and nitrides, such as, but not limited to, TiO, ZrO, TiAlZrO, AlO, or organic materials. According to an embodiment, the first and second dielectric caps are made with the same material. According to an additional embodiment, first dielectric caps 125 and second dielectric caps 126 are made from different materials.

Embodiments of the invention may also include one or more first through vias 123 and second through vias 124. According to embodiments of the invention, the first and second through vias 123, 124 are integrated into the alternating pattern of the first and second interconnect lines 121,122. As such, in embodiments of the invention, a first through via 123 is formed below a first interconnect line 121 and a second through via 124 is formed below a second interconnect line 122. According to an embodiment, the first and second through vias 123, 124 provide the ability to make an electrical connection through the ILD 103 to a lower level. For example, the electrical connection to the lower level may be made to a conductive line, an S/D contact of a transistor device, or any other feature of a semiconductor device that requires an electrical connection. Illustrations presented in the Figures of the present invention omit the structures of the lower level that may be contacted by the first and second through vias in order to not unnecessarily obscure the present invention.

Similar to the first and second overhead vias 117, and 118, the first and second through vias 123, 124 are formed within the same trench as the first and second interconnect lines 121, 122, respectively, and are therefore, referred to herein as being "self-aligned" with the interconnect lines 121, 122. Due to the self-alignment, the alignment between the interconnect lines and the through vias are substantially error free.

A dashed line is illustrated between the first through via 123 and the first interconnect line 121 and between the second through via 124 and the second interconnect line 122 to more clearly indicate where the interconnect lines end and the through vias begins. However, it is to be appreciated that the two features may be formed with the same material, and there may be no discernable junction between them when viewed in the cross-sectional view illustrated in FIG. 1. Referring briefly again to FIG. 4A, a cross-sectional view that is orthogonal to the view of FIG. 1 is provided in order to more clearly illustrate the difference between the interconnect lines and the through vias. As illustrated in FIG. 4A, a first interconnect line 421 in has a length that is greater than the length of a first through via 423. The remainder of FIG. 4A will be discussed in greater detail below.

Figure 2:
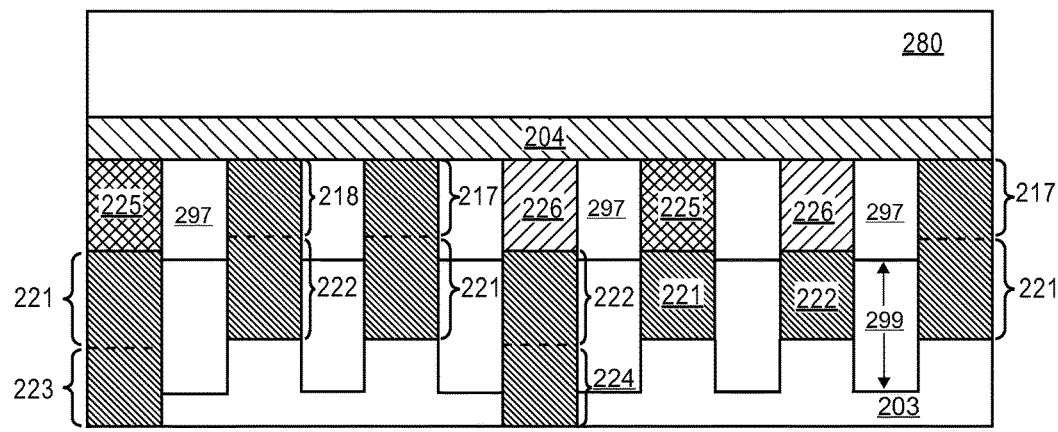
FIG. 2 is a cross-sectional illustration of an interconnect structure that includes an air gap between interconnect lines, according to an embodiment.

Referring now to FIG. 2, an interconnect structure 200, according to an additional embodiment of the invention is illustrated. Interconnect structure 200 is substantially similar to interconnect structure 100, with the exception that air gaps 299 are provided between each of the interconnect lines 121, 122. As the pitch between interconnect lines decreases, capacitive coupling between the lines becomes an increasingly difficult problem to overcome. Typically, the capacitive coupling may be minimized by choosing a low-k dielectric material for the ILD layer 203. However, certain applications may necessitate a k-value that is below the k-values of materials currently used to form ILD layers. Accordingly, embodiments of the invention utilize air gaps 299 to minimize capacitive coupling. For example, an air gap has a k-value of approximately 1.

According to an embodiment, the bottom surface of the air gaps 599 are formed by the ILD layer 203. In an embodiment, the air gaps 299 may have a bottom surface that is below a bottom surface of the first and second interconnect lines 221, 222. According to an additional embodiment, the air gaps may not extend below a bottom surface of the first and second interconnect lines 221, 222. Embodiments of the invention may utilize an ILD fill material 297 to form the upper surface of the air gaps 299. By way of example, the ILD fill material 297 may be an ILD material that has fill characteristics that do not allow for trenches formed between neighboring interconnect lines to be filled by the material. By way of example, the ILD fill material may be a silicon dioxide, carbon doped silicon dioxide, porous silicon dioxide, silicon nitrides, or the like. In an embodiment, a bottom surface of the fill ILD material 297 may extend below a top surface of the first and second interconnect lines 221, 222. According to an additional embodiment, a bottom surface of the fill ILD material 297 may not extend below a top surface of the first and second interconnect lines 221, 222.

Embodiments of the invention benefit greatly from the usage of air-gaps 299 due to the positioning of the interconnect lines 221, 222 within the ILD layer 203. Since the top surfaces of the first and second interconnect lines 221, 222 are recessed below a top surface of the ILD layer 203, the air gap 299 is positioned proximate to the sidewalls of the interconnect lines. According to an embodiment, the air gaps 299 may extend along at least one-half of the length of the sidewall of the interconnect lines. In certain embodiments, the air gaps 299 may extend at least along substantially the entire length of the sidewalls of the interconnect lines. In contrast, traditional interconnect lines are formed so that their top surfaces are substantially coplanar with the top surface of the ILD layer 103. As such, when an air gap is attempted to be formed in these traditional interconnect structures, the fill ILD is formed along a substantial portion of the sidewall of the interconnect lines. Accordingly the benefit of the low-k value is not fully realized as it is according to embodiments of the present invention.

Figure 3A:
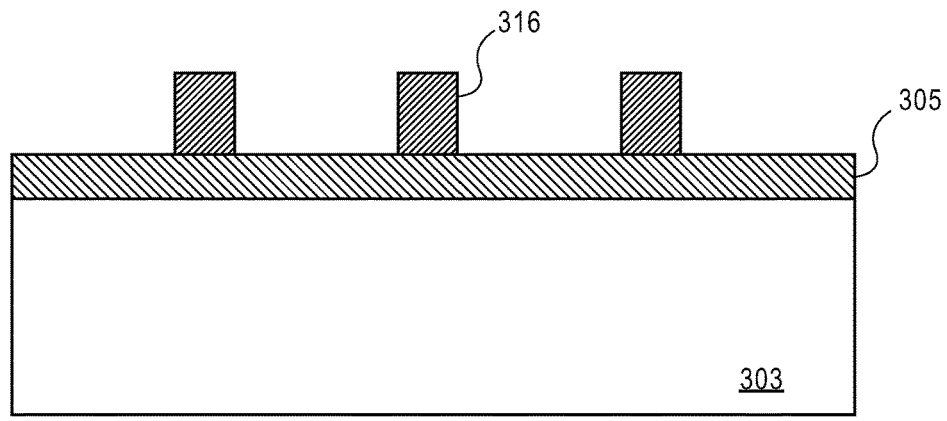
FIGS. 3A-3P are cross-sectional illustrations that illustrate a method of forming an interconnect structure that includes self-aligned overhead vias and self-aligned through vias, according to an embodiment.
Figure 3B:
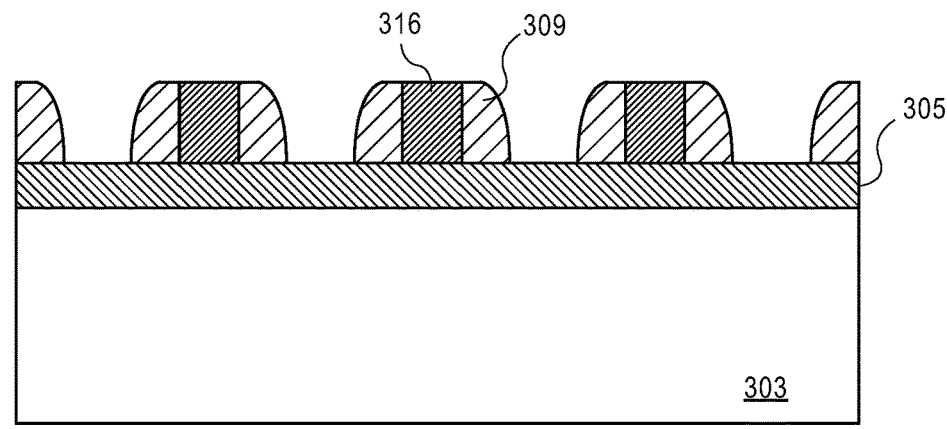
Figure 3C:
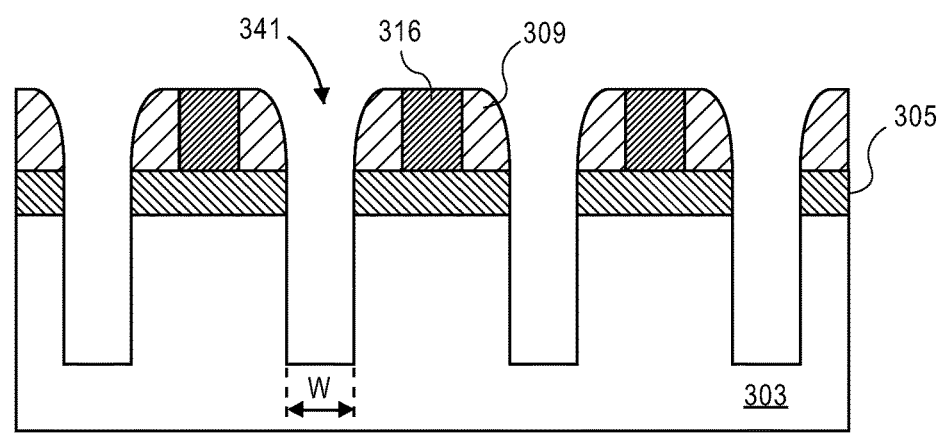
Figure 3D:
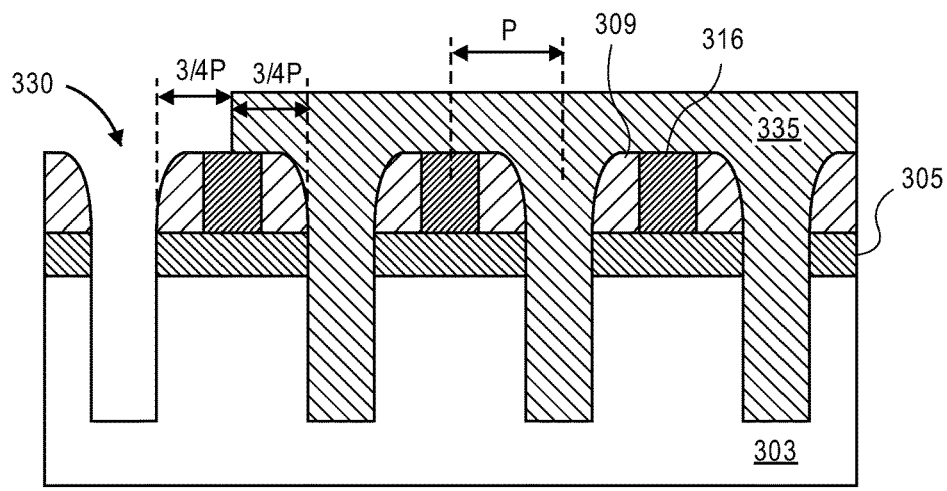
Figure 3E:
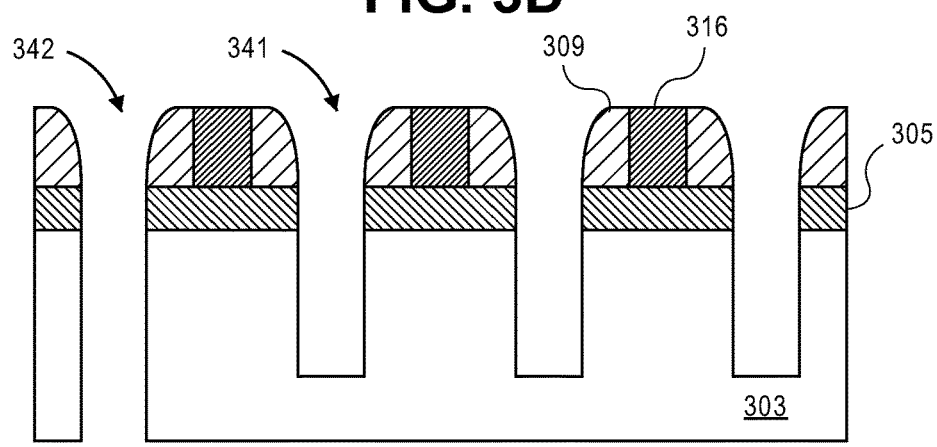
Figure 3F:
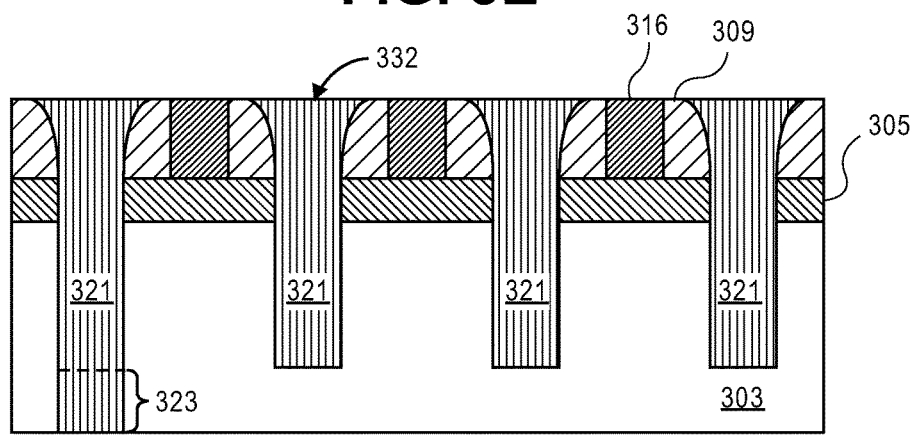
Figure 3G:
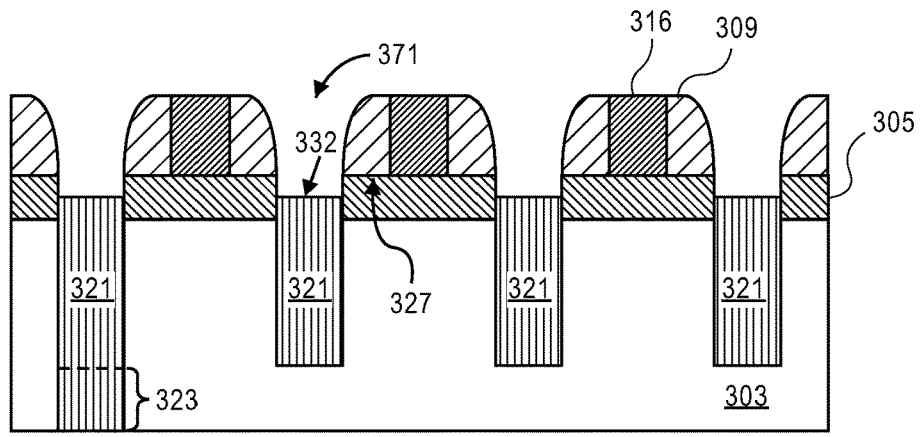
Figure 3H:
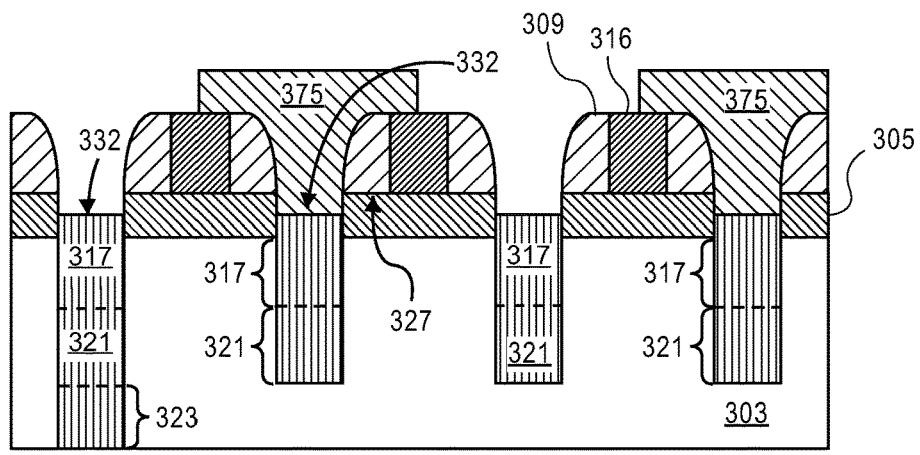
Figure 3I:
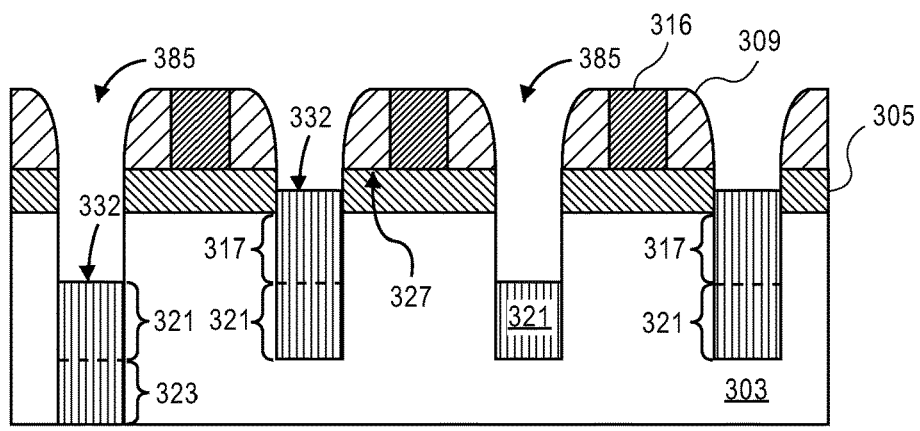
Figure 3J:
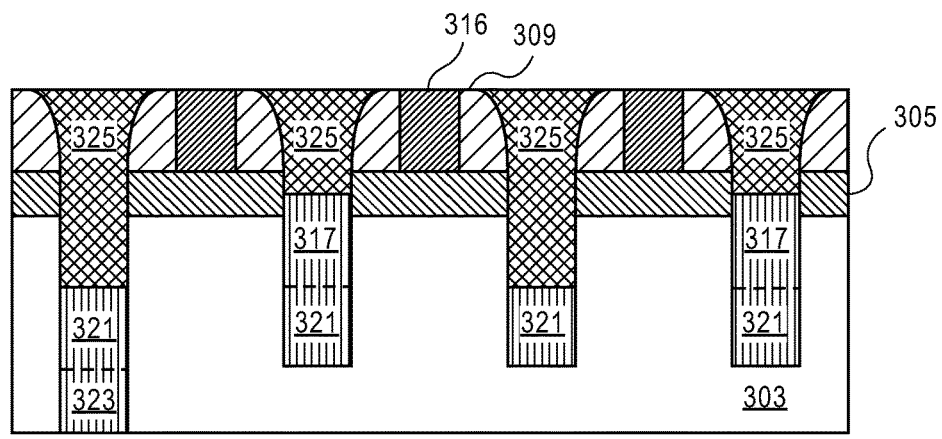
Figure 3K:
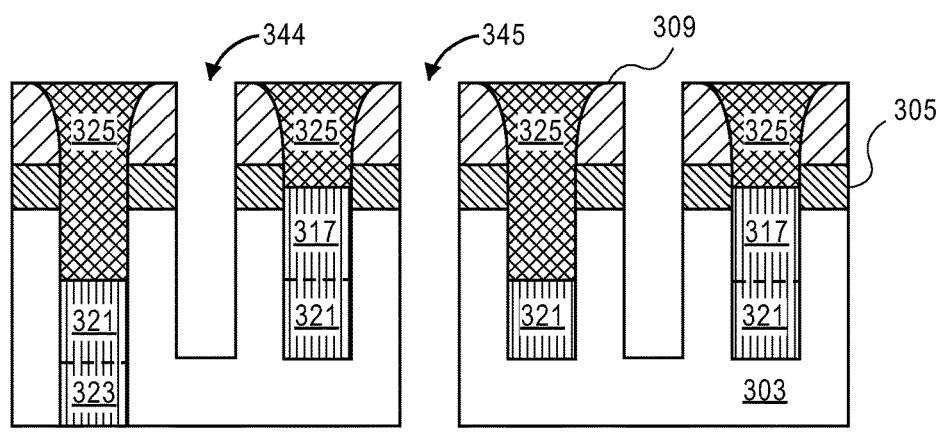
Figure 3L:
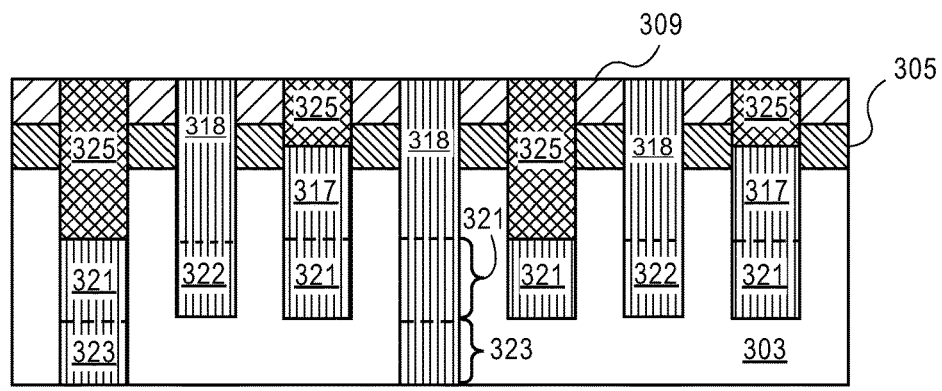
Figure 3M:
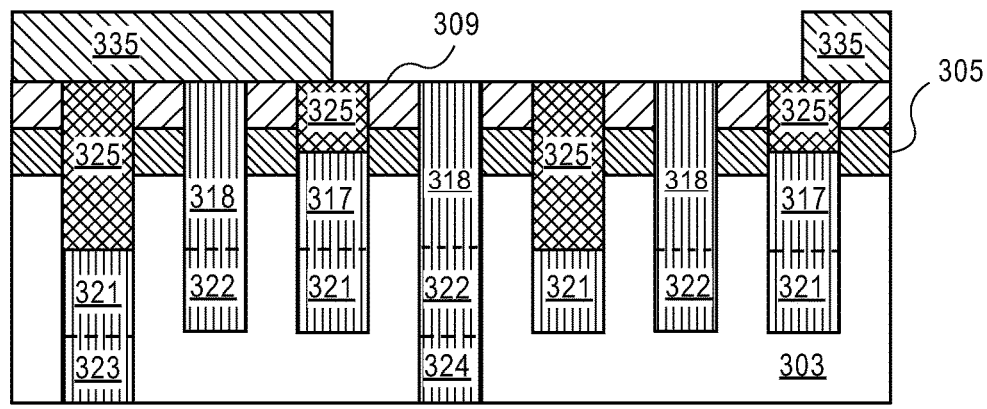
Figure 3N:
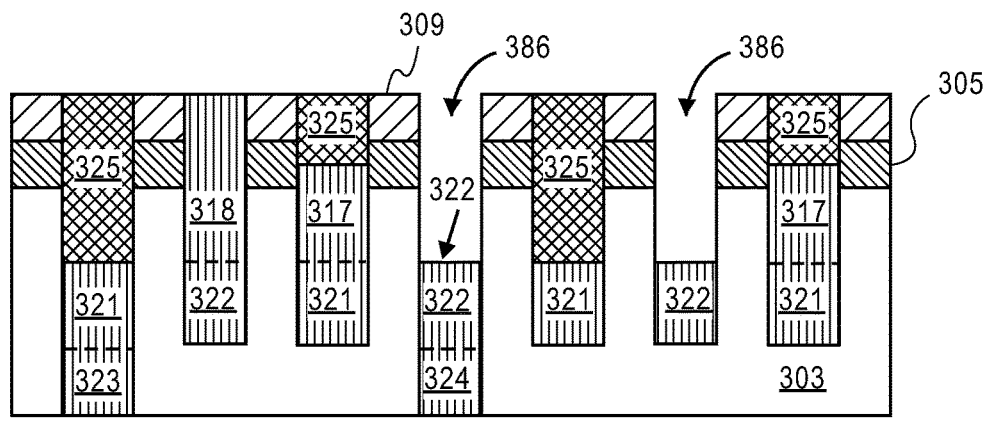
Figure 3O:
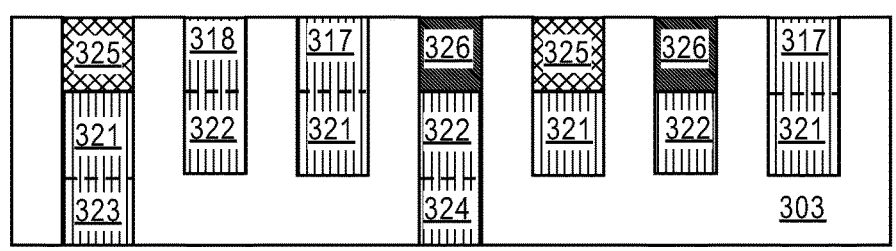
Figure 3P:
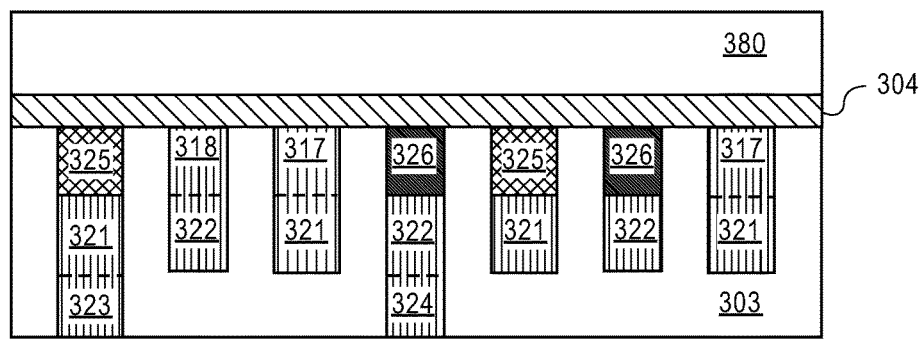

Interconnect structures according to embodiments of the invention may be manufactured according to the process described with respect to FIGS. 3A-3P. Referring now to FIG. 3A, an ILD layer 303 is shown. By way of example, the ILD layer 303 may be any ILD material known in the art, such as carbon doped silicon dioxide, porous silicon dioxide, or silicon nitrides. According to an embodiment, a first hardmask layer 305, such as a nitride or an oxide material, may be formed over the ILD layer 303. According to embodiments, ILD 303 may be formed over one or more additional interconnect structures (not shown), or ILD 303 may be formed over a device substrate, such as a semiconducting substrate on which electrical circuitry is formed (not shown).

A backbone layer 316 may be formed above the first hardmask layer 305. The backbone 316 may be any material suitable for the formation of a hardmask layer, such as amorphous silicon, polysilicon, amorphous carbon, silicon nitride, silicon carbide, germanium, or the like. The backbone 316 may be patterned with any conventional patterning process, such as lithography, etch, and wet cleans. In a specific embodiment, the backbone 316 may be formed with a multiple-patterning process in order to obtain a desired pitch.

Referring now to FIG. 3B, spacers 309 may be formed along the sidewalls of the backbone 316. A spacer formation deposition and etching process may be used to form the spacers 309. For example, a conformal layer of spacer material may be blanket deposited over the surfaces of the backbone 316 and the first hardmask layer 305. After the blanket deposition, a spacer forming etch may be implemented. Embodiments include an anisotropic dry etching process that selectively removes the portions of the deposited layer that are formed on horizontal surfaces, thereby leaving spacers 309 along the sidewalls of the backbone 316. According to an embodiment, the spacers 309 may be a conformal material, such as, but not limited to $SiO_2$, SiN, $HfO_2$, TiO, ZrO, AlN, AlO, and combinations thereof. According to an embodiment of the invention, the material used to form the backbone 316 may have a high etch selectivity over the material used to form the spacers 309 during a given etching process. According to such embodiments, the spacers 309 is resistant to an etching process that will readily etch away the backbone 316. By way of example, when the backbone 316 is made from an amorphous silicon, then the spacers 309 may be made with titanium oxide.

Referring now to FIG. 3C, a first trench etching process is used to form first trenches 341 through the first hardmask layer 305 and into the ILD 303. The first trench etching process utilizes the spacers 309 as a mask in order to provide the proper spacing between the first trenches 341 and to form the first trenches 341 with the desired width W. According to an embodiment of the invention, the width W is less than approximately 30 nm. An additional embodiment of the invention includes a width W that is less than 15 nm. In an embodiment, the first trenches 341 may have a depth between approximately 20 nm and approximately 60 nm. Additional embodiments of the invention include forming the first trenches 341 to a depth of approximately 40 nm.

Referring now to FIG. 3D, a through via masking process may be implemented according to an embodiment of the invention. A carbon hardmask 335 is formed into the trenches 341 and above the spacers 309. As illustrated in FIG. 3D, the carbon hardmask 335 may be patterned to form an opening 330 above one of the first trenches 341. According to an embodiment, the allowable error margin for defining the edges of the carbon hardmask is approximately three-quarters of the pitch P, since only the first trenches 341 have been formed. As such, the edge of the carbon hardmask 335 may be targeted to land on the center of the backbone 316 that is the immediate neighbor to the location where the via opening 330 is desired. For example, if the second trenches 344 that will subsequently be formed below the backbones 316 were already formed, then the edge of the carbon hardmask 335 would need to be centered on the nearest neighboring spacer 309 instead of over the center of the nearest neighboring backbone 316. As such, embodiments of the invention allow for variation in the size of the opening in the hardmask 335, and the relative placement of the opening of the hardmask 335 that is approximately three times greater than the current state of the art. Specifically, embodiments of the invention allow for an error in alignment of the sidewall of the patterned carbon hardmask 335 that is approximately three-quarters of the pitch P, whereas the current state of the art allows alignment error of only one-quarter of the pitch P.

Referring now to FIG. 3E, a through via etching process etches through the remaining portions of the ILD 303 below the bottom of the first trench to form a first through via opening 342. Since the first through via opening 342 is formed though the bottom of a first trench, it is to be appreciated that the through via opening is self-aligned with first trench 341. Therefore, the alignment between the first interconnect line and the first through via will be substantially error free. The first through via opening 342 may provide a connection to layers or features below ILD 303. In an embodiment, the via etching process may also etch through one or more layers of a lower interconnect level, such as, for example, and etchstop layer (not shown). While a single first through via opening 342 is shown, embodiments may also include interconnect levels with more than one first through via opening 342.

Referring now to FIG. 3F, the remaining portions of the carbon hardmask layer 335 are removed and a conductive layer may be formed in the first trenches 341 to form the first interconnect lines 321 and in the through via opening 342 to form the first through via 323 and a first interconnect line 321, according to an embodiment. It is to be appreciated that the first through via 323 is self-aligned with the first interconnect line formed above. A dashed line is illustrated to more clearly indicate where the first interconnect line 321 ends and the first through via 323 begins, however, it is to be appreciated that the two features may be formed with the same material, and there may be no discernable junction between them when viewed in the cross-sectional view illustrated in FIG. 3F. Referring briefly to FIG. 4A, a cross-sectional view that is orthogonal to the view of FIG. 3F is provided in order to more clearly illustrate the difference between the first interconnect lines 321 and the first through via 323. As illustrated the first interconnect line 421 in FIG. 4A has a length that is greater than the length of the first through via 423.

Embodiments of the invention include first interconnect lines 321 and first through vias 323 that are formed with a conductive material that may be any conductive metal used for interconnect lines, such as copper, cobalt, tungsten, or the like. Embodiments include disposing the conductive material into the first trenches 341 and the through via openings 342 with a deposition process known in the art, such as, but not limited to, chemical vapor deposition (CVD), atomic layer deposition (ALD), or electroplating. According to an embodiment, the top surfaces 332 of the first interconnect lines 321 may be planarized with the top surfaces of the spacers 309 in order to remove overflow material from the metal deposition. According to an embodiment, the planarization may be performed with a process such as chemical-mechanical planarization (CMP) or an etching process.

Referring now to FIG. 3G, the top surfaces 332 of the first interconnect lines 321 are recessed with an etching process to form recesses 371 between the spacers 309. According to an embodiment, the top surfaces 332 are recessed such that they are below a top surface 327 of the first hardmask layer 305. According to an embodiment, the recessing of the first interconnect lines 321 may be implemented with an etching process. By way of example, the etching process may be a wet or dry etching process. In a specific embodiment that utilizes a copper or cobalt material to form the first interconnect lines 321 a wet etching process that utilizes a citric acid may be used. In another embodiment that utilizes a tungsten or ruthenium material to form the first interconnect lines 321, a dry etching process may be used.

In FIGS. 3H and 3I, an overhead via patterning process is illustrated, according to an embodiment. As illustrated, the upper portion of each of the first interconnect lines 321 may be considered a first overhead via 317. As such, the device illustrated in FIG. 3H may include a first overhead via 317 at any possible location where a via may be needed. Since the first overhead vias 317 are formed in the same trench as the first interconnect lines 321, it is to be appreciated that the first overhead vias 317 are self-aligned with the first interconnect lines 321. Therefore, the alignment between the first interconnect line 321 and the first overhead via 317 will be substantially error free. In an embodiment, the locations where a first overhead via 317 are not needed may be selectively removed with a patterning and etching process.

In FIG. 3H, a hardmask layer 375 may be disposed into the recesses 371 above the first interconnect lines and over the backbone 316 and spacers 309. Openings may then be patterned into the hardmask 375 above selected first interconnect lines 321. The selected first interconnect lines 321 are lines that will not be contacted from above by a first overhead via 317. As illustrated, the edge of the opening in the hardmask 375 may be located proximate to the center of a backbone 316 that is the immediate neighbor to the selected first interconnect line 321. Accordingly, the margin for edge placement error is approximately three-quarters of the pitch P in either direction, according to an embodiment.

Thereafter, in FIG. 3I, the exposed first overhead vias are removed, to form recesses 385. According to an embodiment, the first overhead vias 317 may be removed with an etching process. By way of example, the etching process may be a wet or dry etching process. In a specific embodiment that utilizes a copper or cobalt material to form the first overhead vias 317, a wet etching process that utilizes a citric acid may be used. In another embodiment that utilizes a tungsten or ruthenium material to form the first overhead vias 317, a dry etching process may be used. According to an embodiment, the remaining first interconnect lines 321 have a height to width aspect ratio that is chosen based on the desired resistance of the interconnect lines. By way of example, the height to width ratio of the first interconnect lines 321 may be approximately 2:1 or greater.

According to an additional embodiment, the one or more first overhead vias 317 may be formed with a metallic growth operation instead of the metallic etch operation described above with respect to FIGS. 3H and 3I. In such an embodiment each metal filled first trench may be etched to remove all of the first overhead vias. Thereafter, a hardmask is deposited above each of the first interconnect lines 317. Next, the hardmask may be patterned to expose the top surfaces 332 of only the first interconnect lines 321 where a first overhead via 317 is desired. Thereafter, the first interconnects 317 may be grown back over the exposed first interconnect lines 321. In an embodiment, the first overhead vias may be grown with a damascene process. For example, a seed layer may first be deposited, followed by an electroless plating, or a deposition process such as an ALD process may be used.

Referring to FIG. 3J, a first dielectric cap 325 may be deposited into the recesses 385 above the first overhead vias 317 and the recesses 371 above the first interconnect lines 321. For example, the first dielectric caps 325 may be deposited with a CVD, PVD, or spin on process. According to an embodiment, any overburden material may be recessed with a planarization process, such as a CMP process. Embodiments of the invention may utilize a material such as SiOxCyNz, non-conductive metal oxides, or metal nitrides for the first dielectric caps 325. Additional embodiments of the invention may select a material for the first dielectric caps 325 that has a high etch selectivity over first hardmask layer 305. Any overburden material from the deposition of the dielectric caps 325 may be planarized with a top surface of the spacers 309 and the backbone 316, for example, with an etching or CMP process.

Referring now to FIG. 3K, the backbone 316 is etched away and second trenches 344 and second through via openings 345 may be made into the ILD 303. According to an embodiment, the remaining portions of the spacers 309 provide a masking layer for use in etching second trenches 344 and second through via openings 345. According to an embodiment, the depth of the second trenches 344 may be substantially similar to the depth of the first trenches 341. According to alternative embodiments, the depth of the second trenches 344 may be greater than or less than the depth of the first trenches 341. According to an embodiment, the process for forming the second through via openings 345 is substantially similar to the process used to form the first through via openings 342 described above with respect to FIGS. 3C and 3E, and therefore will not be repeated herein.

Second through via opening 345 may provide a connection to layers or features below ILD 303. In an embodiment, the via etching process may also etch through one or more layers of a lower interconnect level, such as, for example, an etchstop layer (not shown). While a single second through via opening 345 is shown, embodiments may also include interconnect structures with more than one second through via opening 345. Since the second through via opening 345 is formed though the bottom of a second trench 344, it is to be appreciated that the second through via opening 345 is self-aligned with second trench 344. Therefore, the alignment between the second interconnect line and the second through via will be substantially error free.

Referring now to FIG. 3L, the second trenches 344 and the second through via opening 345 are filled with a conductive material and any overburden may be polished back to form the second interconnects 322 and the second overhead vias 318. In an embodiment, the conductive material may be the same conductive material used to form the first interconnects 322. In an additional embodiment, the conductive material may not be the same metal used for the first interconnects 322. By way of example, the conductive material may be any metal typically used for interconnect lines, such as copper, cobalt, tungsten, ruthenium or the like the. As illustrated in FIG. 3L, the polishing process to remove the overburden may also remove a portion of the spacers 309 and a portion of the first dielectric caps 325.

In FIGS. 3M and 3N, an overhead via patterning process is illustrated, according to an embodiment. As illustrated, the upper portion of each of the second interconnect lines 322 may be considered a second overhead via 318. As such, the device illustrated in FIG. 3M may include a second overhead via 318 at any possible location where a via may be needed. Since the second overhead vias 318 are formed in the same trench as the second interconnect lines 322, it is to be appreciated that the second overhead vias 318 are self-aligned with the second interconnect lines 322. Therefore, the alignment between the second interconnect line 322 and the second overhead via 318 will be substantially error free. In an embodiment, the locations where a second overhead via 318 are not needed may be selectively removed with a patterning and etching process.

In FIG. 3M, a hardmask layer 335 may be disposed over the exposed top surfaces of the device. One or more openings may then be patterned into the hardmask 335 above selected second interconnect lines 322. The selected second interconnect lines 322 are lines that will not be contacted from above by a second overhead via 322. As illustrated, the edge of the hardmask layer 335 may be located proximate to the center of a first dielectric cap 325 that is the immediate neighbor to the selected second interconnect line 322. Accordingly, the margin for edge placement error is approximately three-quarters of the pitch P in either direction, according to an embodiment.

Thereafter, in FIG. 3N, the exposed second overhead vias are removed, to form recesses 386. According to an embodiment, the second overhead vias 318 may be removed with an etching process. By way of example, the etching process may be a wet or dry etching process. In a specific embodiment that utilizes a copper or cobalt material to form the first overhead vias 318, a wet etching process that utilizes a citric acid may be used. In another embodiment that utilizes a tungsten or ruthenium material to form the first overhead vias 318, a dry etching process may be used.

According to an additional embodiment, the one or more second overhead vias 318 may be formed with a metallic growth operation instead of the metallic etch operation described above with respect to FIGS. 3M and 3N. In such an embodiment each metal filled second trench may be etched to remove all of the second overhead vias. Thereafter, a hardmask is deposited above each of the first interconnect lines 317. Next, the hardmask may be patterned to expose the top surfaces 332 of only the second interconnect lines 322 where a second overhead via is desired. Thereafter, the second interconnects 317 may be grown back over the exposed second interconnect lines 321. In an embodiment, the second overhead vias may be grown with a damascene process. For example, a seed layer may first be deposited, followed by an electroless plating, or a deposition process such as an ALD process may be used.

Referring to FIG. 3O, a second dielectric cap 326 may be deposited into the recesses 386 above the above the first interconnect lines 321. For example, the second dielectric caps 326 may be deposited with a CVD, PVD, or spin on process. Embodiments of the invention may utilize a material such as SiOxCyNz, non-conductive metal oxides, or metal nitrides for the second dielectric caps 326. In an embodiment, the material used for the second dielectric caps 326 may be the same material used for the first dielectric caps 325. Alternatively, the second dielectric caps 326 may be a different material than the first dielectric caps 325. According to an embodiment, any overburden material may be recessed with a planarization process, such as a CMP process. The planarization process may also remove the remaining portions of the spacers 309 and the first hardmask layer 305, according to an embodiment.

According to an embodiment, the resulting structure includes a plurality of first and interconnect lines 321 and 322 formed in an alternating pattern within the ILD layer 303. Overhead vias 317 and 318 are exposed and are aligned above corresponding interconnect lines 321, 322 with substantially no overlay error. Additionally, through vias 323, 324 are aligned below corresponding interconnect lines 321, 322 with substantially no overlay error. Interconnect lines 321, 322 that do not require an overhead via are electrically isolated from the top surface by either first or second dielectric caps.

Referring now to FIG. 3P, an etchstop layer 304 may be deposited over a top surfaces of the ILD layer 303, the first and second dielectric caps 325, 326, and the first and second overhead vias 317, 318, according to an embodiment. In an embodiment, a second ILD layer 380 may then be deposited over the top surface of the etchstop layer 304. Accordingly, one or more contacts, or an additional interconnect layer may then be patterned in the second ILD layer 380.

Figure 4B:
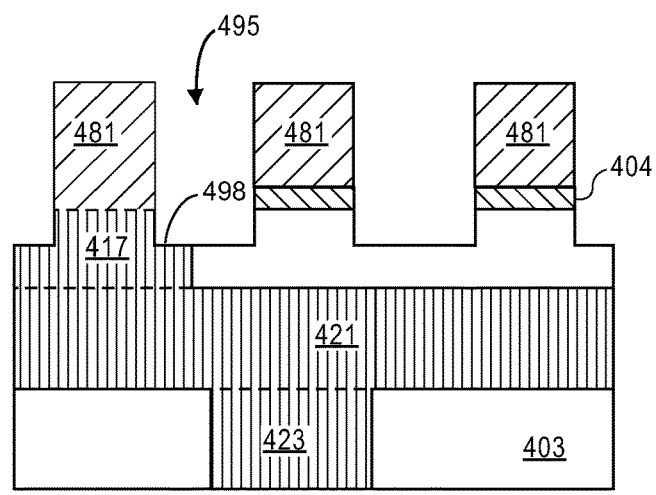
Figure 4C:
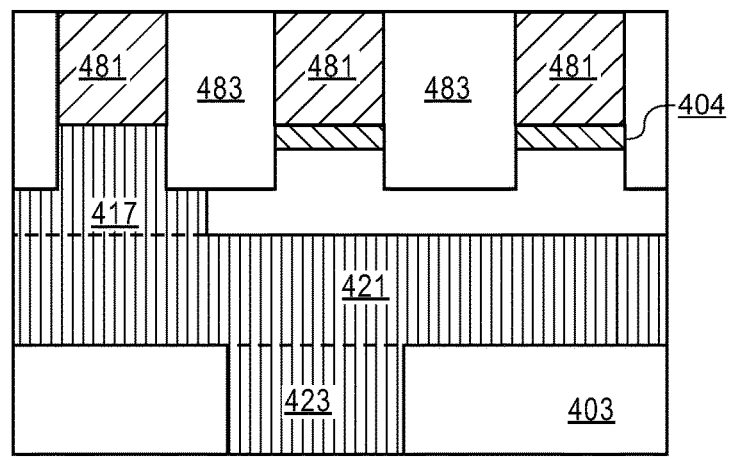

Referring now to FIGS. 4A-4C, cross-sectional illustrations of the interconnect layer 100 along the length of an interconnect line 421 are shown, according to an embodiment. The views illustrated in FIGS. 4A-4C are orthogonal (i.e., rotated 90 degrees) from the cross-sectional views illustrated in FIGS. 3A-3P. As illustrated in FIG. 4A, an interconnect line 421 is formed in an ILD, in substantially the same manner as described above with respect to FIGS. 3A-3P. In the illustrated embodiment, a through via 423 and an overhead via 417 are also formed along the interconnect line 421. Electrical contacts 481 have been formed in the second ILD 480. According to an embodiment, the second contacts 481 may be formed with known metal deposition and lithography process for making electrical contacts 481.

While the overhead vias 417 formed according to embodiments of the invention are self-aligned with the interconnect lines 421, they may not be perfectly aligned with the electrical contact 481 formed in the second ILD 480. As illustrated, the length of the electrical contact 481 above the overhead via 417 is less than the length of the overhead via 417. Accordingly, in an embodiment of the invention, an edge of the overhead via 417 may be formed proximate to a neighboring contact 481. Therefore, in order to reduce the possibility of shorting the overhead via 417 to a neighboring contact 418, embodiments of the invention may include an overhead via etching process, as illustrated in FIGS. 4B and 4C.

Referring now to FIG. 4B, trenches 495 are formed between neighboring contacts 481. In an embodiment, trenches are formed with an etching process that removes the ILD 480 and the etchstop layer 404 that are formed between the contacts 481. The etching process may also etch through a portion of the overhead via 417 and the ILD 403. As illustrated, a notch 498 is formed into the overhead via 417. The presence of the notch increases the spacing between the overhead via 417 the neighboring contacts 481. In an embodiment, the etching process may be selective to the metal that is used to form the overhead via relative to the metal used to form the contacts 481. By way of example, the overhead via may be a different material than the material used to form the contacts. According to an additional embodiment, the contacts 481 may be protected with a photoresist or hardmask material (not shown), and a directional etch may be used to remove the exposed portion of the overhead via 417 without etching away the contacts 481. Accordingly, embodiments of the invention allow for a greater margin against shorting the overhead via 417 to the wrong contact 481. After the formation of the trenches 495, the trenches may be filled with an ILD fill material 483 in order to electrically isolate the overhead via 417, as illustrated in FIG. 4C. By way of example, the ILD fill 483 may be deposited with a typical process such as CVD.

Figure 5A:
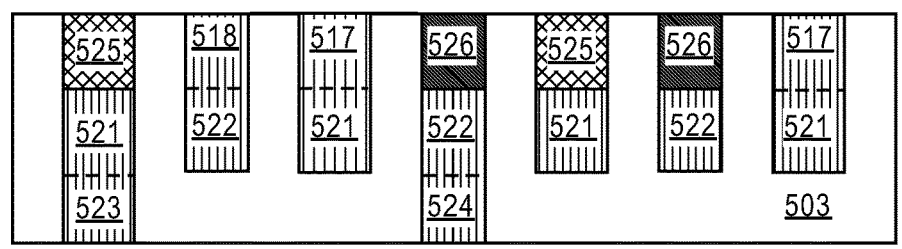
FIGS. 5A-5D are cross-sectional illustrations that illustrate a method of forming an interconnect structure that includes an air gap between interconnect lines, according to an embodiment.

Referring now to FIGS. 5A-5D, a process for forming an interconnect layer 200 substantially similar to the one illustrated in FIG. 2 is illustrated. Referring now to FIG. 5A, the interconnect layer illustrated is substantially similar to the interconnect layer described above with respect to FIG. 3O. As such, the interconnect layer may be formed with substantially similar processing operations to those described above with respect to FIGS. 3A-3O, and therefore will not be repeated here.

Figure 5B:
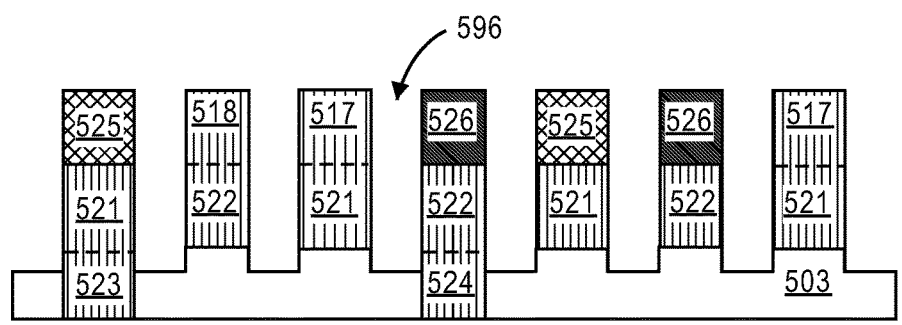

Referring now to FIG. 5B, an ILD recessing operation is performed in order to form trenches 596 into the ILD 503. According to an embodiment, the recessing operation may be performed with a wet or dry etching process that selectively removes the ILD layer 503. For example, a dry etching process may use a $CF_4$ etching chemistry, and a wet etch may use a diluted hydrofluoric acid (dHf) etch. In an embodiment, the trenches 597 may be formed to a depth that is below a bottom surface of the first and second interconnect lines 521, 522. According to an additional embodiment, the trenches 596 may not extend below a bottom surface of the first and second interconnect lines 521, 522.

Figure 5C:
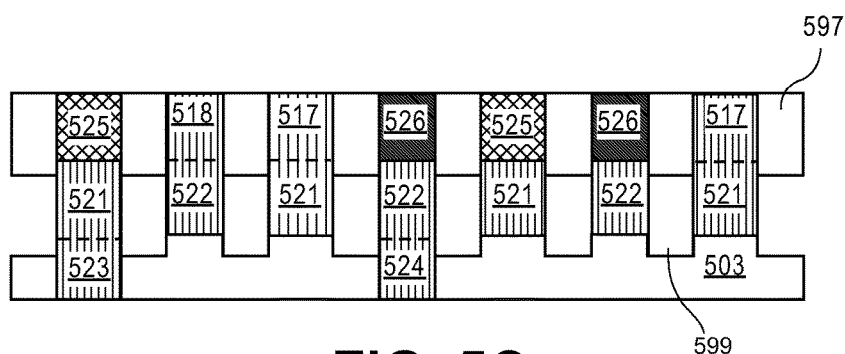

Referring now to FIG. 5C, a fill ILD material 597 may be deposited that partially fills the trenches 596. By way of example, the fill ILD material 597 may have poor fill characteristics, and therefor may not be able to fill the trenches due to the narrow pitch between the neighboring interconnect lines. In an embodiment, a bottom surface of the fill ILD material 597 may extend below a top surface of the first and second interconnect lines 521, 522. According to an additional embodiment, a bottom surface of the fill ILD material may 597 not extend below a top surface of the first and second interconnect lines 521, 522. Accordingly, air gaps 599 are formed between each first and second interconnect line 521, 522. As described above, the presence of the air gaps 599 provide an extremely low dielectric constant (e.g., a k-value of approximately 1) and therefore allows for decreased capacitive coupling between neighboring interconnects.

Figure 5D:
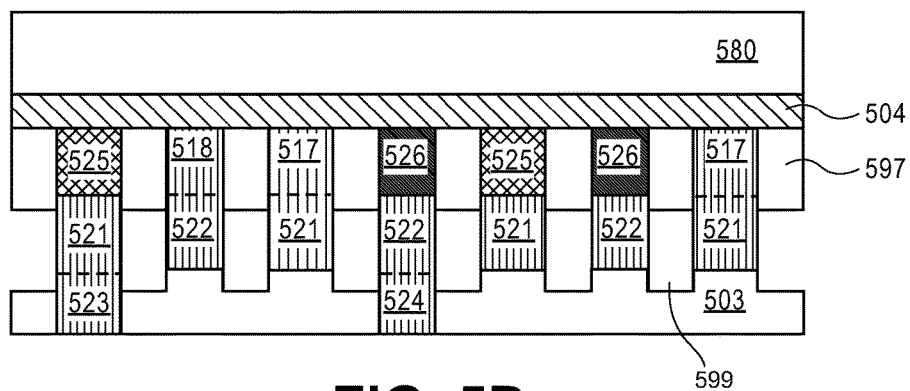

Referring now to FIG. 5D, an etchstop layer 504 may be deposited over a top surfaces of the ILD fill material 597, the first and second dielectric caps 525, 526, and the first and second overhead vias 517, 518, according to an embodiment. In an embodiment, a second ILD layer 580 may then be deposited over the top surface of the etchstop layer 504. Accordingly, one or more contacts, or an additional interconnect layer may then be patterned in the second ILD layer 580.

Figure 6:
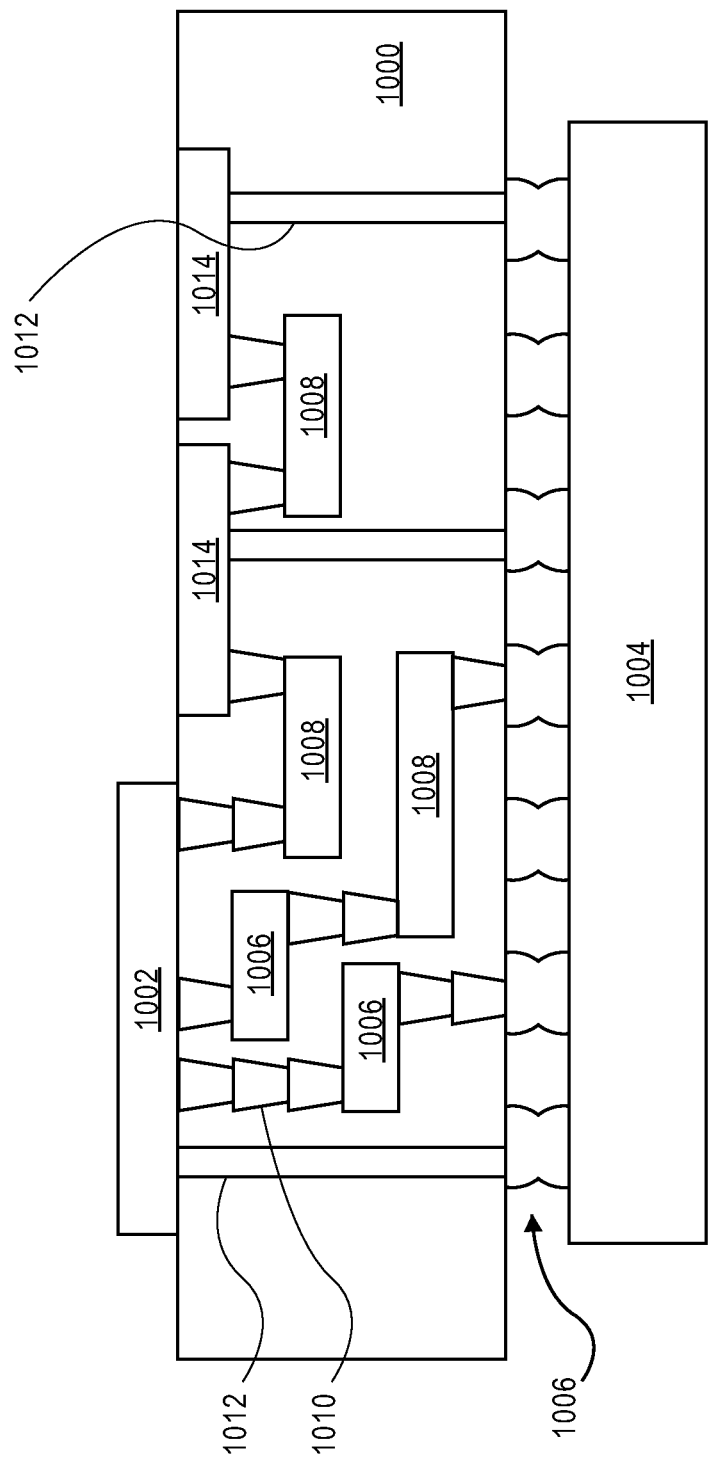
FIG. 6 is a cross-sectional illustration of an interposer implementing one or more embodiments of the invention.
Figure 7:
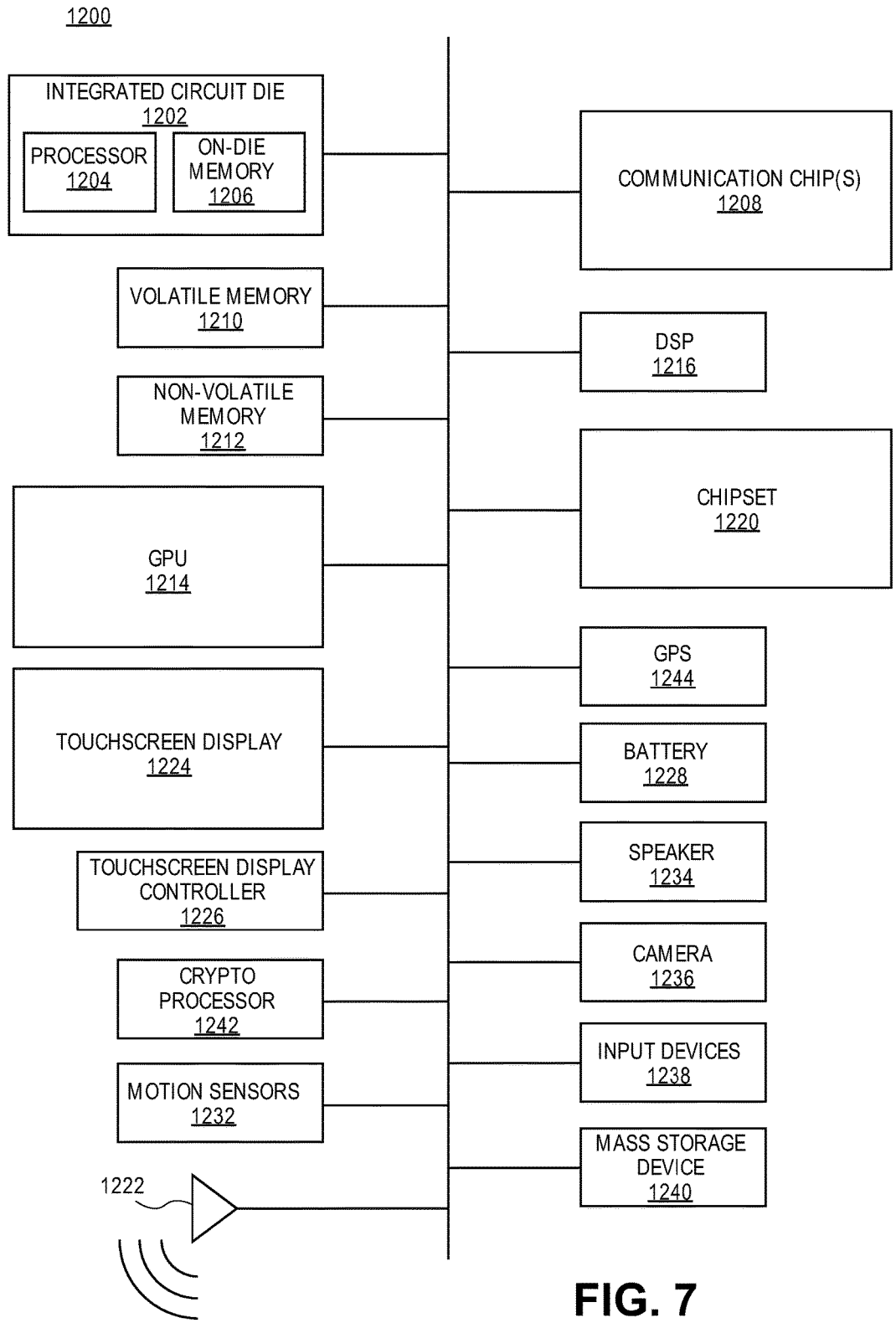
FIG. 7 is a schematic of a computing device built in accordance with an embodiment of the invention.

FIG. 6 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein may be used in the fabrication of interposer 1000 or in the devices 1014.

FIG. 6 illustrates a computing device 1200 in accordance with one embodiment of the invention. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors that are coupled to one or more interconnect lines that are formed in an interconnect structure that includes self-aligned overhead vias and self-aligned through vias in accordance with embodiments of the invention. The term "processor" may refer to any device or portion of a device that processes electronic data from registers and/or memory to transform that electronic data into other electronic data that may be stored in registers and/or memory.

The communication chip 1208 may also include one or more devices, such as transistors that are coupled to one or more interconnect lines that are formed in an interconnect structure that includes self-aligned overhead vias and self-aligned through vias in accordance with embodiments of the invention.

In further embodiments, another component housed within the computing device 1200 may contain one or more devices, such as transistors that are coupled to one or more interconnect lines that are formed in an interconnect structure that includes self-aligned overhead vias and self-aligned through vias in accordance with embodiments of the invention.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

An embodiment of the invention includes an interconnect structure comprising: an interlayer dielectric (ILD); one or more first interconnect lines in the ILD, wherein a top surface of each of the first interconnect lines is recessed below a top surface of the ILD; one or more second interconnect lines in the ILD arranged in an alternating pattern with the first interconnect lines, wherein a top surface of each of the second interconnect lines is recessed below a top surface of the ILD; and a self-aligned overhead via over one or more of the first interconnect lines or over one or more of the second interconnect lines, wherein the self-aligned overhead via includes a top surface that is substantially coplanar with a top surface of the ILD. An additional embodiment includes an interconnect structure, further comprising one or more self-aligned through vias below one or more of the first interconnect lines or below one or more of the second interconnect lines. An additional embodiment includes an interconnect structure, wherein a dielectric cap is formed over first and second interconnect lines that do not have a self-aligned overhead via formed over them. An additional embodiment includes an interconnect structure, wherein the dielectric caps are a $SiO_xC_yN_z$ material, a metal oxide material, or a metal nitride material. An additional embodiment includes an interconnect structure, wherein the self-aligned overhead via includes a notch. An additional embodiment includes an interconnect structure, further comprising a contact metal formed over the top surface of the overhead via. An additional embodiment includes an interconnect structure, wherein the contact metal is a different material than the overhead via. An additional embodiment includes an interconnect structure, wherein an air gap is formed in a space between one or more of the first interconnect lines and the second interconnect lines. An additional embodiment includes an interconnect structure, wherein the air gap extends along at least half the height of the sidewalls of the first and second interconnect lines. An additional embodiment includes an interconnect structure, wherein the air gap extends along the entire height of the sidewalls of the first and second interconnect lines. An additional embodiment includes an interconnect structure, wherein the first and second interconnect lines have a height to width ratio that is 2:1 or greater. An additional embodiment includes an interconnect structure, wherein the first interconnect lines are spaced less than 30 nm from the second interconnect lines.

An additional embodiment includes a method of forming an interconnect structure comprising: forming a plurality of first trenches into an interlayer dielectric (ILD); disposing a first metal into the first trenches to form first interconnect lines and first self-aligned overhead vias over the first interconnect lines; removing one or more of the first self-aligned vias to expose a top surface of one or more of the first interconnect lines; forming first dielectric caps above the exposed top surfaces of the first interconnect lines; forming one or more second trenches into the ILD in an alternating pattern with the first trenches; disposing a second metal into the one or more second trenches to form second interconnect lines and second self-aligned overhead vias; removing one or more of the second self-aligned overhead vias to expose a top surface of one or more of the second interconnect lines; and forming second dielectric caps above exposed top surfaces of the second interconnect lines. An additional embodiment includes a method of forming an interconnect structure, wherein forming the first trenches comprises: forming a backbone layer above a first hardmask layer formed over the ILD; forming spacers on the backbone layer, wherein a portion of the first hardmask layer remains exposed between the spacers; and etching through the exposed portions of the first hardmask layer and into the ILD underneath the exposed portions of the first hardmask layer. An additional embodiment includes a method of forming an interconnect structure, wherein forming the second trench comprises: etching through the backbone layer; and etching through portions of the first hardmask layer and into the ILD. An additional embodiment includes a method of forming an interconnect structure, further comprising: etching through portions of the ILD underneath one or more of the first trenches to form one or more first through via openings prior to disposing the first metal into the first trenches, and wherein disposing the first metal into the first trenches further includes forming first self-aligned through vias in the first through via openings. An additional embodiment includes a method of forming an interconnect structure, further comprising: etching through portions of the ILD underneath one or more of the second trenches to form second through via openings prior to disposing the second metal into the second trenches, and wherein disposing the second metal into the second trenches further includes forming second self-aligned through vias in the second through via openings. An additional embodiment includes a method of forming an interconnect structure, wherein the first and second interconnect lines have a height to width ratio that is 2:1 or greater. An additional embodiment includes a method of forming an interconnect structure, further comprising: removing the ILD from between one or more of the first interconnect lines and the second interconnect lines; and disposing an ILD fill material onto the interconnect structure that does not fill the space proximate to sidewalls of the first interconnect lines and the second interconnect lines. An additional embodiment includes a method of forming an interconnect structure, wherein the sidewalls of the first interconnect lines and the second interconnect lines are not contacted by the ILD or the ILD fill material. An additional embodiment includes a method of forming an interconnect structure, wherein the first An additional embodiment includes a method of forming an interconnect structure, wherein the dielectric caps are a $SiO_xC_yN_z$ material, a metal oxide material, or a metal nitride material.

An additional embodiment includes a method of forming an interconnect structure, comprising: forming a backbone layer above a first hardmask layer formed over an ILD; forming spacers on the backbone layer, wherein a portion of the first hardmask layer remains exposed between the spacers; etching through the exposed portions of the first hardmask layer and into the ILD underneath the exposed portions of the first hardmask layer to form a plurality of first trenches into the interlayer dielectric (ILD); disposing a first metal into the first trenches to form first interconnect lines and first self-aligned overhead vias over the first interconnect lines; removing one or more of the first self-aligned vias to expose a top surface of one or more of the first interconnect lines; forming first dielectric caps above the exposed top surfaces of the first interconnect lines; etching through the backbone layer; etching through portions of the first hardmask layer and into the ILD to forming one or more second trenches into the ILD in an alternating pattern with the first trenches wherein the first trenches are spaced apart from the second trenches by less than 30 nm; disposing a second metal into the one or more second trenches to form second interconnect lines and second self-aligned overhead vias; removing one or more of the second self-aligned overhead vias to expose a top surface of one or more of the second interconnect lines; and forming second dielectric caps above exposed top surfaces of the second interconnect lines. An additional embodiment includes a method of forming an interconnect structure, wherein the first and second interconnect lines have a height to width ratio that is 2:1 or greater. An additional embodiment includes a method of forming an interconnect structure, further comprising: removing the ILD from between one or more of the first interconnect lines and the second interconnect lines; and disposing an ILD fill material onto the interconnect structure that does not fill the space proximate to sidewalls of the first interconnect lines and the second interconnect lines.

What is claimed is:

1. An interconnect structure comprising:
an interlayer dielectric (ILD) with a top surface and a bottom surface:
first interconnect lines in the ILD, wherein a top surface of each of the first interconnect lines is recessed below the top surface of the ILD, and wherein a bottom surface of each of the first interconnect lines is above the bottom surface of the ILD;
second interconnect lines in the ILD arranged in an alternating pattern with the first interconnect lines, wherein a top surface of each of the second interconnect lines is recessed below the top surface of the ILD and wherein a bottom surface of each of the second interconnect lines is above the bottom surface of the ILD; and
a self-aligned overhead via over one or more of the first interconnect lines or over one or more of the second interconnect lines, wherein the self-aligned overhead via includes a top surface that is substantially coplanar with a top surface of the ILD.

2. The interconnect structure of claim 1, further comprising one or more self-aligned through vias below one or more of the first interconnect lines or below one or more of the second interconnect lines.

3. The interconnect structure of claim 1, wherein a dielectric cap is formed over first and second interconnect lines that do not have a self-aligned overhead via formed over them.

4. The interconnect structure of claim 3, wherein the dielectric caps are a $SiO_xC_yN_z$ material, a metal oxide material, or a metal nitride material.

5. The interconnect structure of claim 1, wherein the self-aligned overhead via includes a notch.

6. The interconnect structure of claim 5, further comprising a contact metal formed over the top surface of the overhead via.

7. The interconnect structure of claim 6, wherein the contact metal is a different material than the overhead via.

8. The interconnect structure of claim 1, wherein an air gap is formed in a space between one or more of the first interconnect lines and the second interconnect lines.

9. The interconnect structure of claim 8, wherein the air gap extends along at least half the height of the sidewalls of the first and second interconnect lines.

10. The interconnect structure of claim 8, wherein the air gap extends along the entire height of the sidewalls of the first and second interconnect lines.

11. The interconnect structure of claim 1, wherein the first and second interconnect lines have a height to width ratio that is 2:1 or greater.

12. The interconnect structure of claim 1, wherein the first interconnect lines are spaced less than 30 nm from the second interconnect lines.

13. A method of forming an interconnect structure comprising:
forming a plurality of first trenches into an interlayer dielectric (ILD);
disposing a first metal into the first trenches to form first interconnect lines and first self-aligned overhead vias over the first interconnect lines;
removing one or more of the first self-aligned vias to expose top surfaces of one or more of the first interconnect lines;
forming first dielectric caps above the exposed top surfaces of the first interconnect lines;
forming a plurality second trenches into the ILD in an alternating pattern with the first trenches;
disposing a second metal into the second trenches to form second interconnect lines and second self-aligned overhead vias;
removing one or more of the second self-aligned overhead vias to expose top surfaces of one or more of the second interconnect lines; and
forming second dielectric caps above exposed top surfaces of the second interconnect lines.

14. The method of claim 13, wherein forming the first trenches comprises:
forming a backbone layer above a first hardmask layer formed over the ILD;
forming spacers on the backbone layer, wherein a portion of the first hardmask layer remains exposed between the spacers; and
etching through the exposed portions of the first hardmask layer and into the ILD underneath the exposed portions of the first hardmask layer.

15. The method of claim 14, wherein forming the second trench comprises:
etching through the backbone layer; and
etching through portions of the first hardmask layer and into the ILD.

16. The method of claim 15, further comprising:
etching through portions of the ILD underneath one or more of the first trenches to form one or more first through via openings prior to disposing the first metal into the first trenches, and wherein disposing the first metal into the first trenches further includes forming first self aligned through vias in the first through via openings.

17. The method of claim 15, further comprising:
etching through portions of the ILD underneath one or more of the second trenches to form second through via openings prior to disposing the second metal into the second trenches, and wherein disposing the second metal into the second trenches further includes forming second self-aligned through vias in the second through via openings.

18. The method of claim 13, wherein the first and second interconnect lines have a height to width ratio that is 2:1 or greater.

19. The method of claim 13, further comprising:
removing the ILD from between one or more of the first interconnect lines and the second interconnect lines; and
disposing an ILD fill material onto the interconnect structure that does not fill the space proximate to sidewalls of the first interconnect lines and the second interconnect lines.

20. The method of claim 19, wherein the sidewalls of the first interconnect lines and the second interconnect lines are not contacted by the ILD or the ILD fill material.

21. The method of claim 13, wherein the first interconnect lines are spaced apart from the second interconnect lines by less than 30 nm.

22. The method of claim 13, wherein the dielectric caps are a $SiO_xC_yN_z$ material, a metal oxide material, or a metal nitride material.

23. A method of forming an interconnect structure comprising:
forming a backbone layer above a first hardmask layer formed over an ILD;

forming spacers on the backbone layer, wherein a portion of the first hardmask layer remains exposed between the spacers;

etching through the exposed portions of the first hardmask layer and into the ILD underneath the exposed portions of the first hardmask layer to form a plurality of first trenches into the interlayer dielectric (ILD);

disposing a first metal into the first trenches to form first interconnect lines and first self aligned overhead vias over the first interconnect lines;

removing one or more of the first self-aligned vias to expose a top surface of one or more of the first interconnect lines;

forming first dielectric caps above the exposed top surfaces of the first interconnect lines;

etching through the backbone layer;

etching through portions of the first hardmask layer and into the ILD to forming one or more second trenches into the ILD in an alternating pattern with the first trenches wherein the first trenches are spaced apart from the second trenches by less than 30 nm;

disposing a second metal into the one or more second trenches to form second interconnect lines and second self-aligned overhead vias;

removing one or more of the second self-aligned overhead vias to expose a top surface of one or more of the second interconnect lines; and forming second dielectric caps above exposed top surfaces of the second interconnect lines.

24. The method of claim 23, wherein the first and second interconnect lines have a height to width ratio that is 2:1 or greater.

25. The method of claim 23, further comprising:

removing the ILD from between one or more of the first interconnect lines and the second interconnect lines; and disposing an ILD fill material onto the interconnect structure that does not fill the space proximate to sidewalls of the first interconnect lines and the second interconnect lines.

* * * * *